United States Patent
Kinoshita et al.

(10) Patent No.: US 9,297,093 B2
(45) Date of Patent: *Mar. 29, 2016

(54) LAYERED BODY HAVING A SINGLE CRYSTAL LAYER

(75) Inventors: Toru Kinoshita, Ibaraki (JP); Kazuya Takada, Tokyo (JP)

(73) Assignee: Tokuyama Corporation, Yamaguchi (JP)

( * ) Notice: Subject to any disclaimer, the term of this patent is extended or adjusted under 35 U.S.C. 154(b) by 1000 days.

This patent is subject to a terminal disclaimer.

(21) Appl. No.: 13/498,344

(22) PCT Filed: Sep. 28, 2010

(86) PCT No.: PCT/JP2010/066806
§ 371 (c)(1),
(2), (4) Date: Mar. 27, 2012

(87) PCT Pub. No.: WO2011/037251
PCT Pub. Date: Mar. 31, 2011

(65) Prior Publication Data
US 2012/0183809 A1 Jul. 19, 2012

(30) Foreign Application Priority Data
Sep. 28, 2009 (JP) ................... 2009-223221

(51) Int. Cl.
*B32B 15/04* (2006.01)
*C30B 29/40* (2006.01)
(Continued)

(52) U.S. Cl.
CPC .............. *C30B 29/403* (2013.01); *C30B 25/183* (2013.01); *H01L 21/0242* (2013.01);
(Continued)

(58) Field of Classification Search
USPC ................. 257/28, 43, 66, 78; 438/93, 565; 117/84; 428/688, 689, 697, 698, 699, 428/701, 702, 700, 704
See application file for complete search history.

(56) References Cited

U.S. PATENT DOCUMENTS

| 6,191,437 B1 | 2/2001 | Sonobe et al. |
| 6,455,877 B1 | 9/2002 | Ogawa et al. |

(Continued)

FOREIGN PATENT DOCUMENTS

| JP | 8148718 A | 6/1996 |
| JP | 2000044400 A | 2/2000 |

(Continued)

OTHER PUBLICATIONS

European Application No. 1081921.8 1353, Supplementary European Search Report, dated Jun. 28, 2013.
(Continued)

*Primary Examiner* — Lauren Robinson
*Assistant Examiner* — Lauren Colgan
(74) *Attorney, Agent, or Firm* — Cahn & Samuels, LLP

(57) ABSTRACT

A layered body having a single crystal layer including a group III nitride having a composition $Al_xGa_yIn_zN$ (wherein, X, Y and Z are rational numbers respectively satisfying $0.9 \leq X \leq 1.0$, $0.0 \leq Y \leq 0.1$, $0.0 \leq Z \leq 0.1$, and $X+Y+Z=1.0$) on a sapphire substrate. The layered body includes an initial single crystal layer that includes the group III nitride composition, an oxygen concentration of $1 \times 10^{20}$ cm$^{-3}$ or more and $5 \times 10^{21}$ cm-3 or less and a thickness of 15 nm or more and 40 nm or less on the sapphire substrate and a second group III nitride single crystal layer including the group III nitride composition and having a reduced oxygen concentration than the initial single crystal layer.

5 Claims, 2 Drawing Sheets

(51) Int. Cl.
  *C30B 25/18* (2006.01)
  *H01L 21/02* (2006.01)
  *H01L 33/00* (2010.01)

(52) U.S. Cl.
  CPC ........ *H01L21/0254* (2013.01); *H01L 21/0262* (2013.01); *H01L 21/02433* (2013.01); *H01L 21/02458* (2013.01); *H01L 33/007* (2013.01)

(56) References Cited

U.S. PATENT DOCUMENTS

| | | | |
|---|---|---|---|
| 6,692,568 B2* | 2/2004 | Cuomo et al. | 117/84 |
| 6,830,949 B2* | 12/2004 | Senda et al. | 438/46 |
| 7,601,985 B2* | 10/2009 | Kinoshita et al. | 257/76 |
| 7,822,089 B2* | 10/2010 | Eichler et al. | 372/45.012 |
| 7,888,154 B2 | 2/2011 | Hirayama et al. | |
| 7,893,424 B2* | 2/2011 | Eichler et al. | 257/13 |
| 8,704,239 B2* | 4/2014 | Kinoshita et al. | 257/75 |
| 2002/0008245 A1* | 1/2002 | Goetz et al. | 257/87 |
| 2003/0039866 A1* | 2/2003 | Mitamura | 428/698 |
| 2004/0051107 A1* | 3/2004 | Nagahama et al. | 257/79 |
| 2008/0054252 A1* | 3/2008 | Eichler et al. | 257/22 |
| 2009/0057688 A1 | 3/2009 | Hirayama | |
| 2010/0219445 A1* | 9/2010 | Yokoyama et al. | 257/101 |

FOREIGN PATENT DOCUMENTS

| | | |
|---|---|---|
| JP | 2001148357 A | 5/2001 |
| JP | 2002026464 A | 1/2002 |
| JP | 2003197540 A | 7/2003 |
| JP | 2009054782 A | 3/2009 |
| JP | 2009081406 A | 4/2009 |
| JP | 2010030877 A | 2/2010 |
| WO | 2009041256 A1 | 4/2009 |

OTHER PUBLICATIONS

Paduano, Quing, et al., "Optimized Coalescence Method for Metalorganic Chemical Vapor Deposition (MOCVD) Growth of High Quality Al-Polarity AlN Films on Sapphire," Jan. 7, 2005, pp. L150-L152.

Slacka, Glen A., et al., "Some Effects of Oxygen Impurities on AlN and GaN," Journal of Crystal Growth, Jan. 1, 2002, pp. 287-298, vol. 246, No. 3-4.

PCT App. No. PCT/JP2010/066806, Notification of Transmittal of Translation of the International Preliminary Report on Patentability, dated Apr. 19, 2012.

Takeuchi, M., et al., "Al- and N-Polar AlN Layers Grown on C-Plane Sapphire Substrates by Modified Flow-Modulation MOCVD," Journal of Crystal Growth, 2007, pp. 360-365, vol. 305.

English abstract of WO200904156 (A1). Apr. 2, 2009.

Niebuhr, R., et al., "Electrical and Optical Properties of Oxygen Doped GaN Grown by MOCVD using N2O," Journal of Electronic Materials, 1987, pp. 1127-1130, vol. 26, No. 10.

Chinese Application No. 201080043215.1, First Office Action, issued Nov. 11, 2013.

English Abstract of JP 2009054782. Mar. 12, 2009.

J. Jasinski et al., "Inversion domains in AlN grown on (0001) sapphire", Applied Physics Letters, Oct. 2003, vol. 83, No. 14 2811-13.

Q. Paduano et al., "Optimized Coalescence Method for the Metalorganic Chemical Vapor Deposition (MOCVD) Growth of High Quality Al-Polarity AlN Films on Sapphire", Japanese Journal of Applied Physics, 2005, vol. 44, pp. 150-152.

O. Reentila, et al., "Effect of the AlN nucleation layer growth on AlN material quality", Journal of Crystal Growth, 310 2008, 4932-34.

English abstract of JP2002026464 (A). Jan. 25, 2002.
English abstract of JP2009081406 (A). Apr. 16, 2009.
English abstract of JP2003197540 (A). Jul. 11, 2003.
English abstract of JP8148718 (A). Jun. 7, 1996.
English abstract of JP201148357 (A). May 29, 2001.
English abstract of JP200044400 (A). Feb. 15, 2000.
English abstract of JP2010030877 (A). Feb. 12, 2010.

* cited by examiner

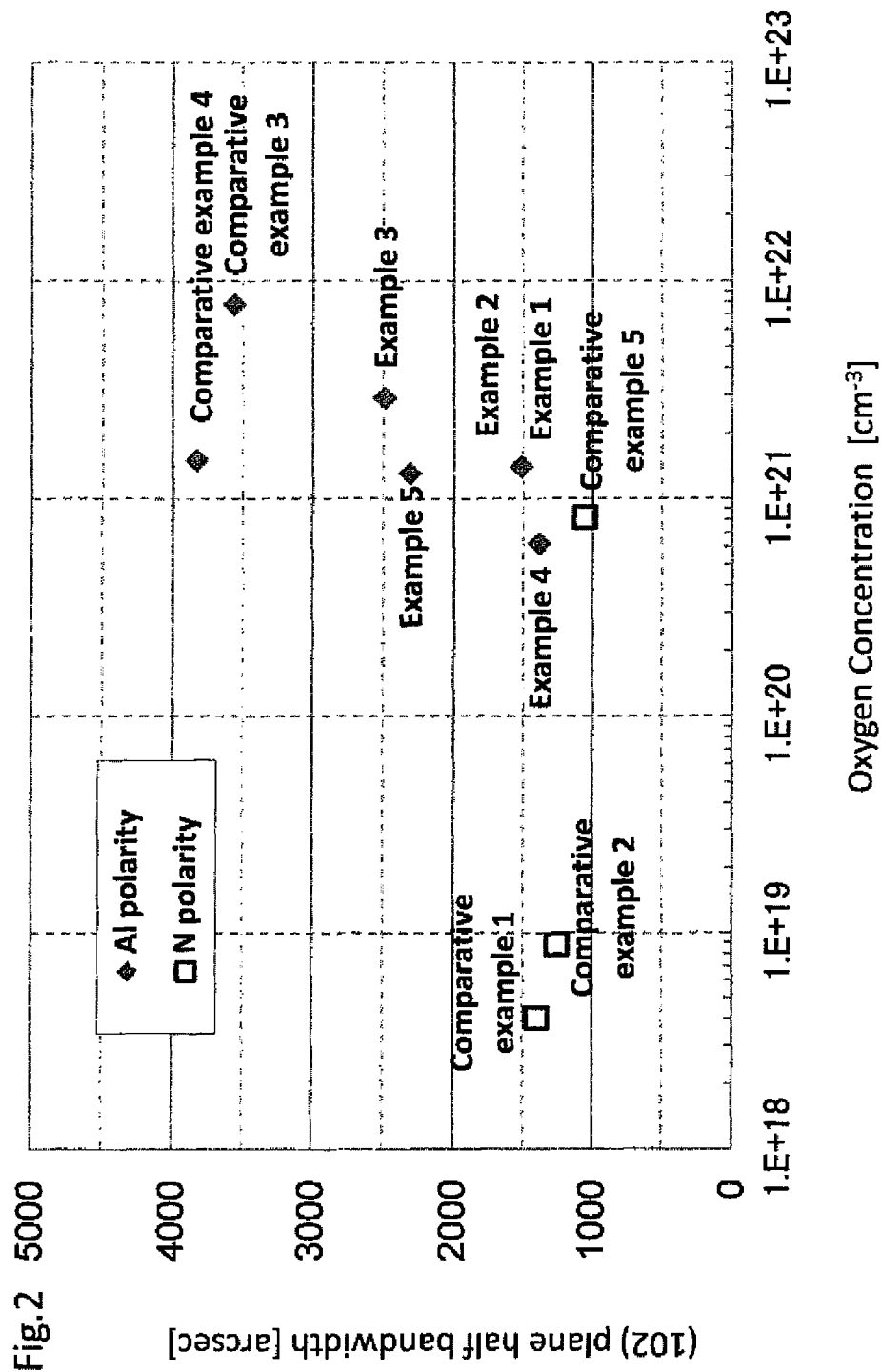

US 9,297,093 B2

LAYERED BODY HAVING A SINGLE CRYSTAL LAYER

This application is a U.S. national stage application of PCT/JP2010/066806 filed on Sep. 28, 2010 which claims priority of Japanese patent document 2009-223221 filed on Sep. 28, 2009, the entirety of which is incorporated herein by reference.

TECHNICAL FIELD

The present invention relates to a novel layered body having a group III nitride single crystal layer on a sapphire substrate by a metal-organic chemical vapor deposition, and a production method thereof. In detail, the present invention relates to a novel layered body capable to be used in an ultraviolet ray emitting element (light emitting diode or laser diode), ultraviolet ray sensor or so, and a production method thereof.

BACKGROUND OF THE INVENTION

A group III nitride semiconductor including aluminum (Al) has a direct transition type band structure in the ultraviolet area corresponding to a wavelength of 200 nm to 360 nm, thus it is possible to manufacture the ultraviolet ray emitting device having high efficiency.

The group III nitride semiconductor device is produced by carrying out a crystal growth of the group III nitride semiconductor thin film on the single crystal substrate using a chemical vapor deposition method such as the metal-organic chemical vapor deposition method (MOCVD method), a molecular beam epitaxy method (MBE method), a halide vapor phase epitaxy method (HYPE method) or so. Among these, MOCVD method is capable to control the film thickness in an atomic layer level, and also can obtain relatively high growing speed; thus it is the method which is most widely used method in the industries.

When producing the above mentioned ultraviolet ray emitting device, it is difficult to obtain a substrate having good compatibility of a lattice constant and a heat expansion coefficient with the group III nitride semiconductor crystal including Al. Therefore, generally, the group III nitride semiconductor crystal including Al is formed on a substrate made of different material such as sapphire substrate or silicon carbide substrate or so. Particularly, when the emitting wavelength is the ultraviolet range, the sapphire substrate is widely used from the point of view of the light transmittance.

Also, in the group III nitride semiconductor crystal including Al, two polarity of a group III polarity (for example, when the group III nitride is AlN, Al polarity) and a nitride polarity (N polarity), which are in a back and front relation. In order to obtain a good device characteristic, it is preferable to control the growth condition so that the growth proceeds by exposing the group III polarity plane on the outset surface on said substrate made of different material (the group III polarity growth). The reason for this is, because, a smooth crystal surface in a atomic level can be obtained in case of the group III polarity growth; however on the other hand, in case of the N polarity growth, many polarity inversion domains in which the group III polarity and the N polarity are mixed in the crystal are generated and the surface roughness of the crystal surface becomes significantly deteriorate compared to the group III polarity growth (for example, refer to Nonpatent Literatures 1 and 2). Particularly, this tendency becomes prominent in case of growing the group III nitride single crystal having high content of Al such as aluminum nitride single crystal (AlN).

In regards with AlN, the group III polarity (Al polarity) and the nitrogen polarity (N polarity) will be further explained. The Al polarity has the crystal growth plane at "0001" plane or +C plane, and is defined as those having a unit of a tetrahedral structure having aluminum atom at the center of the tetrahedron (the center of the gravity), and having nitrogen (N) atom at four apex. Also, Al polarity growth refers to the growth while forming such unit. On the contrary to this, the N polarity has a crystal growth plane of "000-1" or -C plane and is defined as those having unit of a tetrahedral structure with N atom at the center of the tetrahedral (the center of the gravity), and having Al atom at four apex. Further, the N polarity growth refers to the growth while forming such unit.

Also, when comparing the characteristics of the physical property of the crystal obtained by these growth, the crystal obtained by the Al polarity growth, the surface smoothness, the chemical resistance and the heat resistance of the "exposed surface" (Al polarity plane) which is the opposite side of the plane joining the sapphire substrate are high; on the other hand, these physical properties of "exposed surface" thereof (N polarity plane) are poor compared to that of Al polarity plane.

As described in above, such difference of the physical properties between each polarity plane is basically the same to the group III nitride single crystal other than AlN, and particularly, to the group III nitride single crystal having high content of AlN; and whether the group III nitride (for example AlN) single crystal grown on the sapphire substrate has carried out the group III polarity growth can be easily determined by using the difference of the above mentioned chemical resistance. That is, the layered body (the layered body formed with the group III nitride single crystal layer on the sapphire substrate) is immersed in the alkaline solution such as potassium hydroxide (KOH) or so, and it can be easily carried out by a simple test of etching test which observes the dissolving condition of the crystal surface after immersing. If the surface of the group III nitride single crystal layer is the group III polarity surface, the etching will not be carried out since it has high resistance against the alkaline solution. On the other hand, if the surface is the N polarity surface, it will be easily etched. Therefore, the group III polarity growth can be determined if the etching mark is not observed by observing the surface of before and after of such test; on the other hand, N polarity growth can be determined if an obvious etching mark is observed.

When growing the group III nitride semiconductor crystal on the sapphire substrate, in order to accomplish the group III polarity growth, it is necessary to intentionally create a condition in which the group III polarity growth can be carried out, that is the condition nearly in a condition that the group III atom is over saturated. As for the specific method to create such condition, before forming the group III nitride single crystal layer on the sapphire substrate, the method to supply only the group III raw material (for example, Al raw material) (for example, refer to Nonpatent Literature 3), or the method to discontinuously supply the group III raw material gas (for example, Al raw material) while without supplying the nitrogen gas during the initial stage of growing the group III nitride single crystal layer (for example, refer to Patent Article 1), or so are proposed.

[Patent Article 1] Japanese Unexamined Patent Publication No. 2009-54782

[Nonpatent Literature 1] Applied Physics Letters vol. 83 (2003) 2811

[Nonpatent Literature 2] Japanese Journal of Applied Physics vol. 44 (2005) L150

[Nonpatent Literature 3] Journal of Crystal Growth 310 (2008) 4932

As the method to accomplish the group III polarity growth, the method to create an over saturated condition of the III group atom by providing the step to supply only the group III raw material (for example Al raw material) is proposed, which is also described in Nonpatent Literature 3 and Patent Article 1.

However, in this case, at the initial stage of growing the group III nitride single crystal, it was necessary to strictly control the supply amount of the group III raw material and the supplying method thereof. Also, according to the Nonpatent Literature 3, in order to allow the further stable group III polarity growth, it was necessary to increase the amount of the group III raw material supplied, however on the other hand, it indicates that the crystal quality tends to decline.

Further, the present inventors has carried out additional experiments to grow the AlN single crystal on the sapphire substrate by following the method disclosed in the Nonpatent Literature 3; then though the Al polarity growth was possible, the substrate after the growth showed slight Al metal color, and the line transmittance at the range of 280 nm or less on above substrate was 60% or less which is low, further the line transmittance against the light of 250 nm was also 60% or less. When producing the ultraviolet emitting device on such AlN layered body, the extraction efficiency of the light released to the outside via AlN layer is significantly lowered, and as a result, the characteristic of the ultraviolet emitting device is expected to be lowered.

Therefore, the first object of the present invention is to propose the novel method that the group III polarity growth can be carried out stably when growing the group III nitride semiconductor crystal such as AlN on the sapphire substrate using the MOCVD method. Also, the second object is to provide the layered body having the group III nitride single crystal layer having a high light transmittance and a good crystal quality on the sapphire substrate by using the above mentioned method.

SUMMARY OF THE INVENTION

The present inventors have examined the growth condition of the group III nitride single crystal on the sapphire substrate in order to solve the above mentioned problems. Particularly, the examination was carried out in regards with the growth condition of the initial stage growing the group III nitride single crystal having high content of Al such as AlN on the sapphire substrate (the single crystal layer formed at said initial stage is also called as initial single crystal layer). As a result, in case the oxygen is supplied with the raw material gas onto the sapphire substrate, at the initial single crystal layer formation, it was found that the stable group III polarity growth takes place. Then, as a result of the examination based on this founding, when the oxygen concentration in the initial single crystal layer and the thickness of the initial single crystal layer are controlled to the predetermined range, and the group III nitride single crystal layer having low oxygen concentration is formed on the initial single crystal layer, it was found that the group III nitride single crystal layer is formed by stable group III polarity growth and the crystallinity of the obtained single crystal layer is good; thereby the present invention was achieved.

That is, the first present invention is;

a production method of a layered body having a single crystal layer comprising a group III nitride satisfying a composition shown by $Al_XGa_YIn_ZN$ (wherein, X, Y and Z are rational numbers respectively satisfying $0.9 \leq X \leq 1.0$, $0.0 \leq Y \leq 0.1$, $0.0 \leq Z \leq 0.1$, and $X+Y+Z=1.0$) on a sapphire substrate by a metal organic chemical vapor deposition method; wherein said production method of the layered body comprises, a first growing step supplying an oxygen source gas to the sapphire substrate with a raw material gas for growing said group III nitride single crystal consisting of a nitrogen source gas and a group III raw material gas, thereby growing an initial single crystal layer comprising the group III nitride satisfying said composition and containing oxygen in a concentration of $1 \times 10^{20}$ cm$^{-3}$ or more and $5 \times 10^{21}$ cm$^{-3}$ or less in a thickness of 15 nm or more and 40 nm or less on said sapphire substrate; and a second growing step of supplying the raw material gas without the oxygen source gas, or supplying the oxygen source gas in a less amount than the first growing step together with the raw material gas onto said initial single crystal layer, thereby growing the second group III nitride single crystal layer comprising the group III nitride satisfying said composition having reduced oxygen concentration than the initial single crystal layer.

The second invention is, a layered body having a single crystal layer comprising a group III nitride satisfying a composition shown by $Al_XGa_YIn_ZN$ (wherein, X, Y and Z are rational numbers respectively satisfying $0.9 \leq X \leq 1.0$, $0.0 \leq Y \leq 0.1$, $0.0 \leq Z \leq 0.1$, and $X+Y+Z=1.0$) on a sapphire substrate, and said layered body has an initial single crystal layer comprising the group III nitride satisfying said composition containing oxygen in a concentration of $1 \times 10^{20}$ cm$^{-3}$ or more and $5 \times 10^{21}$ cm$^{-3}$ or less in a thickness of 15 nm or more and 40 nm or less on said sapphire substrate, and a second group III nitride single crystal layer comprising the group III nitride satisfying said composition having reduced oxygen concentration than the initial single crystal layer. In such layered body, the surface of the second nitride single crystal layer is a group III polarity plane.

Also, the third invention is a semiconductor device comprising said layered body.

According to the present invention, in case of growing the group III nitride single crystal having high Al content such as shown by the formula of $Al_XGa_YIn_ZN$ and $X \geq 0.9$ using the MOCVD method, the group III nitride single crystal can be grown by stable group III polarity growth. Further, group III nitride single crystal obtained as a result thereof has smooth surface in an atomic level, and has good crystallinity. Further, the layered body obtained by the method of the present invention is uses as the sapphire substrate having high light transmittance even to the ultraviolet ray, thus by using as the ultraviolet emitting device substrate, it becomes possible to improve the light emitting property of the device.

BRIEF DESCRIPTION OF THE DRAWINGS

FIG. 2 is a figure showing the relation between the oxygen concentration in the initial single crystal layer and the crystallinity of a second group III nitride single crystal layer.

DETAILED DESCRIPTION OF THE INVENTION

Figure 1:
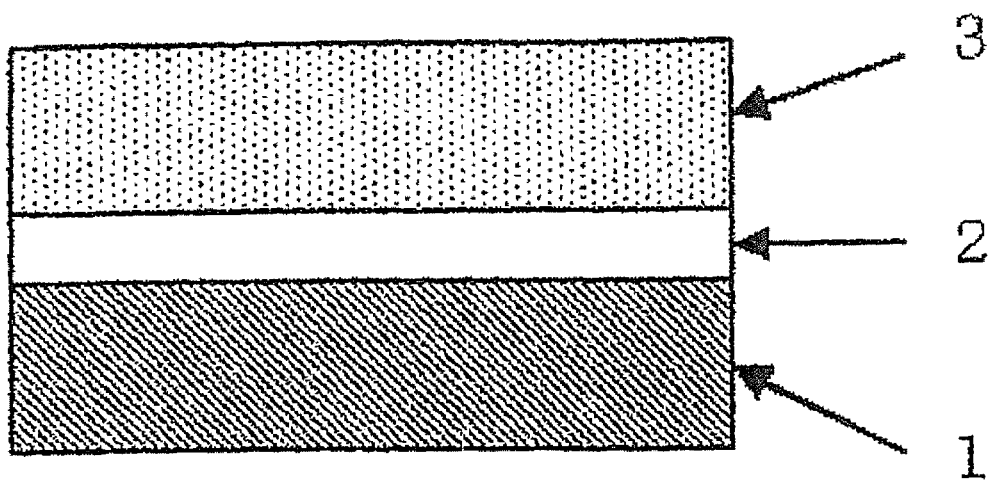
FIG. 1 is a schematic view shown in the embodiment of the layered body of the present invention.

The present invention relates to the production method of a layered body having a single crystal layer comprising a group III nitride satisfying a composition shown by $Al_XGa_YIn_ZN$ (wherein X, Y and Z are rational numbers respectively satisfying $0.9 \leq X \leq 1.0$, $0.0 \leq Y \leq 0.1$, $0.0 \leq Z \leq 0.1$, and $X+Y+Z=1.0$) on a sapphire substrate by MOCVD method.

Then, it is characterized by comprising a first growing step supplying an oxygen source gas to the sapphire substrate with a raw material gas for growing said group III nitride crystal consisting of a nitrogen source gas and a group III raw material gas thereby growing an initial single crystal layer comprising the group III nitride satisfying said composition and containing oxygen in a concentration of $1 \times 10^{20}$ cm$^{-3}$ or more and $5 \times 10^{21}$ cm$^{-3}$ or less in a thickness of 15 nm or more and 40 nm or less on said sapphire substrate; and a second growing step of supplying the raw material gas without the oxygen source gas, or supplying the oxygen source gas in a less amount than the first growing step together with the raw material gas onto said initial single crystal layer, thereby growing the second group III nitride single crystal layer comprising the group III nitride satisfying said composition having reduced oxygen concentration than the initial single crystal layer.

Hereinafter, the present invention will be described in detail by following the step.

(The MOCVD Method and the Device Used)

In the present invention, the group III nitride single crystal layer is grown by the metal organic chemical vapor deposition method (MOCVD method). This MOCVD method grows the group III nitride single crystal layer on the substrate by supplying the raw material gas such as the group III raw material gas for example the metal organic gas such as triethylaluminum, and the nitrogen source gas for example ammonium gas to the substrate. In the method of the present invention, the apparatus is not particularly limited as long as such MOCVD method can be carried out, and known MOCVD apparatus or the MOCVD apparatus commercially available can be used without any limitation.

However, during the formation of the group III nitride single crystal, from the point of view to minimize the unintended introduction of the impurities as less as possible, and of the easy control of the oxygen concentration of the initial single crystal layer, as for the MOCVD apparatus, it is preferable to use, for example, the apparatus having the structure capable of suppressing the amount of the impurities generated from the substrate surrounding member which becomes high temperature due to the radiation when the heat is applied to the substrate, and particularly the amount of the oxygen or so generated from the material constituting the substrate surrounding member to minimal. Specifically, it is preferable to use, at the place heated to 1000° C. or higher due to the radiation from the substrate, the apparatus using the material comprising the high purity ceramics such as boron nitride or AlN to the surface portion contacting at least with the raw material gas or so.

(The Basic Composition of the Group III Nitride Single Crystal)

The initial single crystal layer and the second group III nitride single crystal layer of the present invention both can be basically made from the group III nitride single crystal shown by said compositional formula. However, from the point of view of production easiness, the light transmittance and the significance of the effect, X, Y, and Z in said compositional formula are preferably $1.0 \geq X \geq 0.95$, $0.05 \geq Y \geq 0$, $0.05 \geq Z \geq 0$, and particularly $X=1.0$ is preferable, that is AlN is preferable.

Note that, the group III nitride single crystal constituting the initial single crystal layer in the method of the present invention contains oxygen in a predetermined concentration, and also the group III nitride single crystal constituting the second group III single crystal layer contains oxygen atom in a concentration lower than that of the initial single crystal layer. However, the amount of the oxygen atom contained in these crystal is a very small amount, and it is a level which can be considered as a so called impurities, thus in the field of the group III nitride single crystal, the basic crystal composition is generally shown without considering the impurities. Therefore, in the present invention, it is treated so as the basic compositional formula of the group III nitride single crystal has no change by the presence of the oxygen.

Also, the compositional formula (the combination of the specific numbers of X, Y, and Z) of the group III nitride single crystal constituting the initial single crystal layer and the second group III nitride single crystal layer may be same or different. Note that, form the point of view of production easiness and the light transmittance, these are preferably the same, and particularly, these are preferably AlN.

(The First Growing Step)

In the present invention, in order to grow the group III nitride single crystal layer of said composition on the sapphire substrate by MOCVD method, first, the first growing step is carried out. That is, at the first growing step, as the raw material gas, the group III raw material gas, the nitrogen source gas and the oxygen source gas are used, and by supplying these onto the sapphire substrate, the initial single crystal layer having said basic composition, and consisting from the group III nitride with oxygen concentration of $1 \times 10^{20}$ cm$^{-3}$ or more and $5 \times 10^{21}$ cm$^{-3}$ or less is grown to the thickness of 15 nm or more and 40 nm or less.

By growing such initial single crystal layer, in the second growing step, the second group III nitride single crystal layer can be stably grow by the group III polarity growth, and also the surface smoothness of said layer and the crystallinity can be enhanced. Further, in case of forming other group III nitride single crystal layer necessary for the semiconductor device on the second group III nitride single crystal layer, the crystallinity of these single crystal layers can be enhanced.

The mechanism how such effect can be obtained is not clear, however the present inventors assumes it is due to the mechanism described in below. That is, in the crystal growth by MOCVD method, at its very beginning stage, the portion which becomes the core of the group III polarity growth (the group III polarity growth core) and the core which become the nitrogen polarity growth (the nitrogen polarity growth core) attaches randomly to the sapphire substrate, and these cores are thought to be grown by competing. At this time, the growth speed of the group III polarity growth is faster than that of the nitrogen polarity growth, thus if the presence density of the group III polarity growth core goes beyond the certain level, even if the nitrogen polarity growth core is present, the group III polarity growth becomes predominant along with the growth proceeds, and at the end, it becomes a complete or almost complete group III polarity growth. At this time, if the presence density of the group III polarity growth core becomes too high, when the single crystal domain grown from each growth core collides against each other, and the defects such as the dislocation or so due to the slight displacement of the direction in between the domains easily occurs which causes the crystallinity to decline.

In the present invention, by controlling the oxygen concentration and the thickness of the initial single crystal layer formed at the first growing step, the presence density of the group III polarity growth core can be controlled suitably high, and thus the present inventors assumes that while preventing deterioration of the crystallinity, the group III polarity growth succeeded in increasing the predominance. Further specifically, in regards with increasing the presence density of the group III polarity growth core, the oxygen has an effect to promote the formation of the group III polarity growth core (the deposition to the substrate surface), and the deposition rate to the substrate surface increases as the concentration of the oxygen gas in said core during the formation of the core and the oxygen concentration included in the initial single crystal layer increases; thus the presence density of the group III growth core is thought to increase. In the method of the present invention, by setting the predetermined upper limit of the oxygen concentration included in the initial single crystal layer, it prevents the presence density of the group III polarity growth core from becoming too high, and prevents the crystallinity from becoming low. However, even if the upper limit of the oxygen concentration is set, along with the crystal growth proceeds (along with the thickness of the initial single crystal layer becomes thicker), a new group III polarity growth core is formed on the nitrogen polarity growth plane, and it was found that the presence density of the group III polarity growth core becomes too high by exceeding the predetermine range and tends to lower the crystallinity. Thus, in the method of the present invention, the upper limit of the thickness of the initial single crystal layer is set; thereby it prevents such lowering of the crystallinity. Then, the surface (the outer most plane) of the initial single crystal layer formed by carrying out such control has good crystallinity and the surface smoothness, and also is in a condition that the group III polarity growth plane occupies majority of places; thus it is considered that it became possible to carry out stable group III polarity growth even when the oxygen supply is stopped at the second growing step.

Hereinafter, the first step is described in detail.

(The Sapphire Substrate)

The sapphire substrate used at the first step is not particularly limited, as long as the group III nitride single crystal layer can be grown on the surface thereof, and known sapphire substrate can be used. As for the sapphire substrate, from the point of the easiness of group III nitride single crystal growth, it is preferable to use the substrate having a crystal growth plane direction of (0001) plane (C plane), or the substrate having OFF angle in which the crystal growth plane is tilted towards the direction of M axis from C plane more than 0° and 0.5° or less. In regards with the thickness, it is not particularly limited, however from the point of the production cost and the easiness to handle, it is preferably 0.1 mm or more and 1.0 mm or less, and more preferably 0.2 mm or more and 0.5 mm or less.

Also, such sapphire substrate is preferably carried out with substrate surface cleaning (the thermal cleaning) by heating at 1200° C. or more, preferably 1250° C. or more in the hydrogen atmosphere after placed in the MOCVD device, before forming the initial single crystal layer as described in the below. Note that, the upper limit temperature of this thermal cleaning is usually 1500° C.

(The Gaseous Material)

As for the gaseous material of the first step, the group III raw material gas, the nitrogen source gas, and the oxygen source gas are used. These gaseous materials are usually supplied to the reaction system (on the substrate in the device) together with a carrier gas such as the hydrogen gas and nitrogen gas or so (this is the same for the second growth step which will be described in the following).

As for the group III raw material gas and the nitrogen source gas, depending on the composition for growing the group III nitride single crystal, the group III raw material gas and the nitrogen source gas which can be used to grow the group III nitride single crystal by MOCVD method can be used without any particular limitation. Specifically, as for the group III raw material gas, trimethyl aluminum, triethyl aluminum, trimethyl gallium, triethyl gallium, or trimethyl indium are preferably used. Note that, the type of the raw material and the used ratio of these group III raw material can be suitably determined depending on the composition of the initial single crystal layer to be grown. Also, as for the nitrogen source gas, it is preferable to use the ammonium gas.

As for the oxygen source gas, the gas which is the supplying source of the oxygen included in the initial single crystal layer, and oxygen gas and a compound gas including the oxygen in its molecule can be used. As for the compound gas including the oxygen in the molecule, the compound which becomes into gas under the growth condition can be used, however from the point of the easiness to handle, the alcohol having 1 to 5 carbon atoms of liquid at the room temperature, and particularly butanol is preferably used.

The oxygen source gas is supplied in a very little amount compared to other gaseous material, thus, as the oxygen source gas, it is preferable to use the gas diluted by the carrier gas in advance. For example, in case of using the gas of "a compound including the oxygen in the molecule" of liquid at the room temperature, said compound in a liquid is maintained under the predetermined temperature condition of the room temperature or above, and by bubbling with the carrier gas such as hydrogen or so, it can be supplied as the oxygen source gas diluted by the carrier gas.

From the point of easiness to accurately control the supplying amount of the oxygen, as for the oxygen source gas, the oxygen gas diluted by the carrier gas such as nitrogen or hydrogen is preferably used. As the diluting method of the oxygen, it is not particularly limited, and the method which dilutes in the gas cylinder in advance, the method which dilute by mixing oxygen gas with the carrier gas such as nitrogen gas or hydrogen gas in the device can be used.

(The Initial Single Crystal Layer and the Forming Step Thereof and the Condition)

The oxygen concentration of the initial single crystal layer formed at the first growing step must be $1\times10^{20}$ cm$^{-3}$ or more and $5\times10^{21}$ cm$^{-3}$ or less. By controlling the oxygen concentration of the initial single crystal layer within the above range, the second group III nitride single crystal layer grown on the initial single crystal layer is stably carried out with the group III polarity growth, and also the defect density in the second group III nitride single crystal layer can be reduced. In order to carry out the group III polarity growth of the second group III nitride single crystal layer further stably, and to further reduce the f defect density, the oxygen concentration of the initial single crystal layer is preferably $5\times10^{20}$ cm$^{-3}$ or more and $4\times10^{21}$ cm$^{-3}$ or less. Here, the oxygen concentration refers to the oxygen atom number included in the single crystal of 1 cm$^3$.

In case the oxygen concentration in the initial single crystal layer is less than $1\times10^{20}$ cm$^{-3}$, as the second group III nitride single crystal layer grown on the initial single crystal layer, the N polarity growth becomes predominant, and this condition changes along with the reduction of the oxygen concentration. According to the examination of the present inventors, when the oxygen concentration is $10^{19}$ cm$^{-3}$ or so, the group III polarity and the N polarity are mixed, and when the oxygen concentration is less than $10^{19}$ cm$^{-3}$, it was found that almost entire plane becomes N polarity plane. Also, in either area, the surface smoothness of the group III nitride single crystal layer is deteriorated compared to the case of the group III polarity growth.

On the other hand, when the oxygen concentration of the initial single crystal layer exceeds $5\times10^{21}$ cm$^{-3}$, the second group III nitride single crystal layer is carried out with stable group III polarity growth, however the defect density of the second group III nitride single crystal layer increases along with the increase of the oxygen concentration.

Note that, this defect density can be measured by counting the number of the dislocation defect by the cross section or plane view observation of the transmission electron microscope (TEM). Also, as other method, it is possible to estimate size of the defect density from (002) plane or (102) plane half bandwidth of the X-ray rocking curve measurement. In this case, it is estimated that the defect density will decrease along with the decreasing of above half bandwidth.

According to the method of the present invention, the second group III nitride single crystal layer can have the half bandwidth of (102) plane preferably 2500 arcsec or less, and further preferably 1500 arcsec or less.

The supplying amount and the gas concentration (the oxygen concentration) of the oxygen source gas at the initial single crystal layer forming may be determined according to the spec of the device and the like so that the oxygen concentration of the initial single crystal layer satisfies the above described range. The intake amount of the oxygen into the crystal and the supplying amount of the oxygen is expected to significantly change depending on the structure of the MOCVD device or the gas introduction method, thus it is preferable to set the gas supply amount and the concentration so that the oxygen concentration becomes within said range by researching in advance the relation between the supplying amount of the oxygen source gas and the oxygen concentration which is taken into the crystal. Note that, considering the usual industrial production, with respect to the group III atom of the group III raw material gas, the mol ratio of oxygen in the oxygen source gas (the oxygen atom/the group III atoms ratio) is preferably controlled within the range of 0.1 or more and 10 or less.

Also, in the present invention, the thickness of the initial single crystal layer (the initial single crystal layer having the oxygen concentration of $1 \times 10^{20}$ cm$^{-3}$ or more and $5 \times 10^{21}$ cm$^{-3}$ or less) formed by supplying the oxygen source gas must be 15 nm or more and 40 nm or less. In case the thickness of the initial single crystal layer is less than 15 nm, since the rate of the group III polarity growth at the initial single crystal layer surface does not become sufficiently high, the group III nitride single crystal layer grown on the initial single crystal layer becomes dominated by the N polarity growth. On the other hand, in case the thickness of the initial single crystal layer exceeds 40 nm, the second group III nitride single crystal layer under goes stable group III polarity growth, however new group III polarity growth core is formed on the nitrogen polarity growth plane; thus the presence density of the group III polarity growth core becomes too high, and the defect density of the group III nitride single crystal layer increases along with the increase of the thickness of the initial single crystal layer. Therefore, in order to carry out the group III polarity growth further stably and to form the group III nitride single crystal layer with a good crystal quality, the thickness of the initial single crystal layer is preferably 15 nm or more and 30 nm or less. Note that, here, the thickness of the initial single crystal layer refers to the average film thickness. As described in above, at the initial single crystal layer forming stage, the group III polarity growth and the N polarity growth occurs competitively; thus at the initial single crystal layer, the portion of the group III polarity growth and the portion of the N polarity growth coexist. Generally, the growth speed of the group III polarity growth is faster than that of the N polarity growth, thus the unevenness of the thickness of the initial single crystal layer is thought to be generated. Thus, in the present invention, the thickness is defined as the thickness (the average thickness) obtained by the product of the time spent to form the initial single crystal layer at the actual first growing step and growth rate. Here, the growth rate is determined based on the result of the experiment carried out separately under the same condition of the actual first growing step, wherein crystal growing is continued for a long term to obtain a film having even thickness (i.e. 0.2 μm).

In the present invention, the supply of the raw material gas at the initial single crystal layer formation is not particularly limited, however it is preferable to set the mol ratio (the ratio of the nitrogen atom/the group III atom) of the nitrogen source gas with respect to the group III raw material gas to 3000 or more and 8000 or less. When the supplying ratio of the raw material gas satisfy this range, it is preferable since the stable group III polarity growth becomes possible and also the reduction of the defect density becomes possible. Also, as long as the raw material gas is supplied with the oxygen source gas, the method thereof is not particularly limited; and it can be supplied by the known method such as supplying the group III raw material gas and the nitrogen source gas simultaneously, supplying each of those alternatively, or supplying either one of the raw material gas intermittently or so. Note that, the group III raw material gas may be controlled so that the ratio thereof is formed from the group III nitride which the initial single crystal layer satisfies said composition.

In regards with the forming temperature (the temperature of the sapphire substrate when forming the initial single crystal layer) of the initial single crystal layer, it is preferably 850° C. or higher and 1150° C. or lower, and particularly preferably 900° C. or higher and 1100° C. or lower. When the forming temperature of the initial single crystal layer satisfies this range, the group III polarity growth of the second group III nitride single crystal layer grown at the second step is achieved further stably, and the defect density of the group III nitride single crystal layer can be further reduced. Also, by setting the forming temperature of the initial single crystal layer within said range, the mixing of the group III polarity growth and the N polarity growth in the initial single crystal layer can be reduced. Further, by setting the forming temperature of the initial single crystal layer within said range, the initial single crystal layer can have good crystallinity (having a narrow half bandwidth at the X ray rocking curve measurement). As a result, the second group III nitride single crystal layer formed on said initial single crystal layer will also have improved surface smoothness and the crystallinity.

Due to the difference of the oxygen concentration included in above mentioned initial single crystal layer and the thickness of the initial single crystal layer, the polarity condition of the second group III nitride single crystal layer formed on said initial single crystal layer and the crystal quality changes. This change is influenced by the polarity condition and the crystal quality of the initial single crystal layer.

According to the result of the observation of the crystal surface by the atomic force microscope (AFM) done by the present inventors, it was found that under the growing condition that N polarity growth becomes predominant as described in the above, the condition of the group III polarity growth of the growth plane of the initial single crystal layer is in an island form; and the covering ratio of the island form crystal (the growth portion of the group III polarity) with respect to the sapphire substrate was approximately 30% or less. On the other hand, under the growing condition in which the group III polarity growth is stably carried out but the defect density is increased, the condition of the group III polarity growth of the growing surface of the initial single crystal layer is in a mesh form; further it was found that the covering ratio with respect to the sapphire substrate is 90% or more. Such results support the mechanism estimated by the present inventors.

Note that, AFM was used for analyzing the polarity of the crystal surface, because it is highly possible that the portion of the group III polarity and the portion of the N polarity are mixed at the crystal plane when a thin film having 40 nm or less are grown such as the initial single crystal layer, and such coexisting condition cannot be evaluated by the above mentioned "the etching test which is the easy method for determining". On the contrary to this, when determining the polarity of the second group III nitride single crystal layer formed at the second step, the second group III nitride single crystal layer is formed in a thickness of usually 0.3 µm or more, and preferably 0.5 µm or more. The total thickness from the initial single crystal layer is sufficient enough to proceed the growth of each crystal core, therefore the surface of the second group III nitride single crystal layer is almost completely either one of group III polarity portion or the N polarity portion. Thus, the polarity of the surface of the second group III nitride single crystal layer can be determined by using said etching test without any problem.

From such results, as for the preferable growing condition of the initial single crystal layer, it is thought that the group III polarity growth grown in an island form or mesh form on the sapphire substrate (surface), and the covering ratio of the group III polarity growth with respect to the sapphire substrate higher than 30% and 90% or less are the most preferable condition. Further, such growing condition in the initial single crystal layer can be attained by the initial single crystal layer having the oxygen concentration and the film thickness satisfying the above described range. Particularly, by setting the forming temperature of the initial single crystal layer within said preferable range, the above growing condition can be attained easily.

Next, in the present invention, the second group III nitride single crystal layer is grown on the initial single crystal layer at the second growing step, thereby the layered body is produced. This second growing step will be described in the following.

(The Second Growing Step)

At the second growing step, on to the initial single crystal layer obtained by the first growing step, said raw material gas is supplied without the oxygen source gas, or the raw material gas is supplied together with the oxygen source gas at the supplying amount less than the first growing step; thereby the layered body is produced by growing the second group III nitride single crystal layer having reduced oxygen concentration compared to the initial single crystal layer. At this time, from the point of view to obtain the second group III nitride single crystal layer having high light transmittance and high crystallinity, it is preferable to not to supply the oxygen source gas at the second growing step.

The second group III nitride single crystal layer grown at the second growing step takes the surface of the initial single crystal layer (the surface under the condition that the covering ratio of the group III polarity growth is more than 30% and less than 90%) as the crystal growing plane, thus the ratio of the group III polarity growth portion occupying the surface of the second group III nitride single crystal layer at the forming step of the second group III nitride single crystal layer gradually increases, and at the end, the ratio increases to 90% or more or nearly 100%. Then, at the forming step of the second group III single crystal layer, the growth of the group III polarity growth core mainly occurs which has already been formed, and new group III polarity growth core is unlikely to happen thus the crystallinity does decline even when the film is made thicker.

In the second growing step, the raw material gas and the oxygen source gas same as those used at said first growing step can be used.

In the present invention, the condition for growing the second group III nitride single crystal layer on said initial single crystal layer can be the same as the condition of the first growing step except for setting the supplying amount of the oxygen source gas to 0, or reducing the supplying amount of the oxygen source gas than the first growing step.

That is, the supply of the raw material gas is not particularly limited, and the ratio of nitrogen atom/group III atom may be 500 or more and 7000 or less. Also, as for the supplying method of the raw material gas, it is not particularly limited, and it can be supplied by known method such as supplying the group III raw material gas and the nitrogen source gas simultaneously, supplying each of those alternatively, or supplying either one of the raw material gas intermittently or so. Note that, the ratio of the group III raw material gas may be controlled so that the second group III nitride single crystal layer is formed from the group III nitride satisfying above mentioned composition.

Further, the forming temperature when forming the group III nitride single crystal layer is not particularly limited, and it may be within the range of 1100° C. or higher and 1500° C. or below.

Also, after forming the initial single crystal layer, in case it is necessary to grow the group III nitride single crystal layer at higher temperature than the initial single crystal layer forming temperature, it is preferable to carry out the following method. For example, it is preferable to supply only the carrier gas, or it is preferable to apply a heat so that the substrate (the initial single crystal layer) becomes to the predetermined temperature while supplying the ammonium gas and the carrier gas.

Note that, by changing the growing condition of the second group III nitride single crystal layer at the middle of the process, the second group III nitride single crystal layer can be a multilayer structure. For example, by laminating the group III nitride single crystal layer having different growing temperature (the forming temperature), the nitrogen atom/group III atom ratio at the growing, or the raw material supplying method or so, the multilayered group III nitride single crystal layer having reduced defect density can be formed.

Note that, the oxygen concentration included in the second group III single crystal layer obtained as such is less than $1\times10^{20}$ cm$^{-3}$, preferably $1\times10^{19}$ cm$^{-3}$ or less and further preferably $1\times10^{18}$ cm$^{-3}$ or less. Usually, since the oxygen is an impurity, the lower the oxygen concentration included in the layered body is, the higher the quality of the crystal is. Therefore, at this second growing step, the embodiment which does not supply the gas including the oxygen is most preferable. Note that, as shown in the below example, even when the device having a member which does not generate the oxygen is used and even when the gas including the oxygen is not supplied, though the reason is not clear, there is a case that the extremely small amount of the oxygen is included in the group III nitride single crystal layer. As a result, it is difficult to make the oxygen concentration in the second group III nitride single crystal layer to below detectable limit.

Also, the thickness of the second group III nitride single crystal layer can be determined accordingly depending on the purpose of the use. When using for the usual semiconductor element, it may be 0.3 µm or more and 5.0 µm or less.

In method of the present invention, by forming the initial single crystal layer having the predetermined oxygen concentration at the first growing step and having predetermined thickness, it allows to make the condition of the exposed surface of the initial single crystal layer to the condition suitable for carrying out the stable group III polarity growth, that is, it makes the surface condition in which the ratio of the group III polarity plane occupying the surface suitably high. Then, by carrying out the second growing step using such plane as the crystal growing plane, even when the group III nitride single crystal layer without the oxygen is formed at said step, the group III polarity growth can be carried out stably, and the crystallinity and the surface smoothness thereof can be enhanced.

Also, the layered body of the present invention which is "the layered body having the initial single crystal layer and the second group III nitride single crystal layer on the sapphire substrate in said order" obtained by the method of the present invention has the exposed surface of the second group III nitride single crystal layer which show a superior group III polarity growth plane, thus it is suitable for forming thereon various single crystal thin layer constituting ultraviolet emitting device, and it can suitably used as the substrate for producing ultraviolet emitting device. Specifically, the light emitting element layer can be formed by having a multilayered structure laminating the buffer layer if necessary, the n-type conductive layer, active layer, and p-type conductive layer, on the second group III nitride single crystal layer in this order. Hereinafter, the layered body of the present invention is described in detail.

(The Layered Body of the Present Invention)

The constitution of the layered body of the present invention is shown in FIG. 1. The layered body of the present invention has the sapphire substrate 1 and the initial single crystal layer 2 comprising a specific composition and the thickness of above mentioned on said substrate 1; and the second group III nitride single crystal layer 3 is stacked on said initial single crystal layer 2.

Further specifically, this multilayered body comprises a initial single crystal layer 2 having the composition shown by $Al_XGa_YIn_ZN$ (note that, X, Y and Z are rational numbers respectively satisfying $0.9 \leq X \leq 1.0$, $0.0 \leq Y \leq 0.1$, $0.0 \leq Z \leq 0.1$, and $X+Y+Z=1.0$) onto a sapphire substrate, and the oxygen concentration is $1 \times 10^{20}$ to $5 \times 10^{21}$ cm$^{-3}$ and a thickness of 15 nm or more and 40 nm or less; and a second group III nitride single crystal layer 3 having the composition shown by said compositional formula and lower oxygen concentration than the initial single crystal layer; further the initial single crystal layer 2 and the group III nitride single crystal layer 3 are stacked in this order. Further, the surface of this group III nitride single crystal layer (the opposite plane of the sapphire substrate 1 side) is preferably a group III polarity plane.

In regards with the layered body of the present invention, because the layered body having high crystallinity of the second group III nitride single crystal layer 3, and the surface thereof having high smoothness at the atomic level and a group III polarity plane can be obtained easily according to the method of the present invention, the group III nitride constituting said initial single crystal layer 2 and the second group III nitride single crystal layer 3 preferably have X, Y, and Z of said compositional formula satisfying $1.0 \geq X \geq 0.95$, $0.05 \geq Y \geq 0$, $0.05 \geq Z \geq 0$, and particularly $X=1.0$ that is AlN is particularly preferable.

Also, the oxygen concentration of the initial single crystal layer 2 is particularly preferably within the range of $5 \times 10^{20}$ to $4 \times 10^{21}$ cm$^{-3}$. Also, the thickness of the initial single crystal layer 2 is particularly preferably 15 nm or more and 30 nm or less.

The oxygen concentration of the second group III nitride single crystal layer 3 is lower than that of the initial single crystal layer 2, and it is less than $1 \times 10^{20}$ cm$^{-3}$, and preferably it is $1 \times 10^{19}$ cm$^{-3}$ or less. Also, the layer thickness is not particularly limited, however it is preferably 0.3 μm or more and 5.0 μm or less, and particularly preferably it is 0.5 μm or more and 4.0 μm or less.

The layered body of the present invention has characteristics of (a) the exposed surface of the second group III nitride single crystal layer 3 shows group III polarity, (b) the smoothness of said surface is high, (c) the crystallinity of the second group III nitride single crystal layer 3 is high, and (d) the transmission of the light, particularly transmission of the deep ultraviolet light or the ultraviolet light is high. Hereinafter, these characteristic will be explained.

(a) In Regards with the Polarity of the Exposed Surface of the Second Group III Nitride Single Crystal Layer 3

As described in the above, the surface condition of the initial single crystal layer formed at the first step is made into a suitable condition as the crystal growth plane carrying out the single crystal growth thereon for carrying out the stable group III polarity growth. Therefore, almost the entire polarity of the exposed surface of the second group III nitride single crystal layer 3 is the group III polarity (for example, 90% or more, and preferably 95 to 100%). The group III polarity of said surface can be easily verified by said etching test. That is, the layered body of the present invention is immersed in the alkaline solution such as potassium hydroxide (KOH) or so, and the dissolved surface condition after immersing may be observed. If the surface is group III polarity surface, it has high resistance against the alkaline solution, thus it is barely etched. On the other hand, if the surface is the N polarity plane, it will be easily etched. The condition of the etching test, for example, the concentration of above KOH solution, the immersing time of the layered body, and the temperature are not particularly limited; however, if a specific test condition is to be shown, the layered body may be immersed in KOH 10 wt % solution for 1 min (minute) or so at room temperature.

(b) In Regards with the Smoothness of the Exposed Surface of the Second Group III Nitride Single Crystal Layer Since the second group III nitride single crystal layer 3 carries out the stable group III polarity growth, the single crystal layer thereof have superior surface smoothness. Specifically, the surface of the group III nitride single crystal layer 3 is possible to be 20 nm or less in arithmetic root mean roughness (RMS), and if the condition is further controlled, it can be 10 nm or less. This transmittance and RMS can be measured by the known transmission measuring device or atomic force microscope (AFM).

(c) In Regards with the Crystallinity of the Second Group III Nitride Single Crystal Layer 3

In the initial single crystal layer surface which becomes the base crystal growing plane of the second group III nitride single crystal layer 3, the presence density of the group III polarity growth core is suitably controlled, thus the defect generation during the second step is suppressed, and the crystallinity of the second nitride single crystal layer 3 becomes high. Specifically, when crystallinity is evaluated by the half bandwidth of (102) plane, said half bandwidth can be 2500 arcsec or less, more preferably 1550 arcsec or less, and particularly 1500 arcsec or less. By controlling the growth condition accurately, the half bandwidth can be reduced to 200 arcsec or so.

(d) In Regards with Light Transmittance of the Layered Body

The layered body of the present invention uses the sapphire having extremely high light transmittance as the base substrate, and the group III polarity growth is stably carried out without using the method which reduces the light transmittance, such as supplying the group III raw material gas or so. Also, the second group III single crystal layer has high crystallinity and the surface smoothness thereof is high; thus the layered body of the present invention can show high light transmittance without carrying out the particular treatment such as the abrasion or so. The light transmittance thereof can be, though it depends on the thickness of the group III nitride single crystal layer 3, 80% or more at the line transmittance within the range of 220 nm to 800 nmm; and the traight transmissivity of the light having the wave length range of 220 nm to 280 nm which is required for the (deep) ultraviolet emitting element substrate, and the straight transmissivity of the wavelength of 250 nm can be 80% or more.

Note that, in case the group III nitride single crystal is carried out with N polarity growth, since the surface of the N polarity plane is rough, said straight transmissivity is as high as 70% or so. In regards with said straight transmissivity only, by increasing the surface smoothness by surface abrasion, the light transmittance as same as the layered body of the present invention can be obtained, however the N polarity growth has narrow crystal growth window and it is not only difficult to carry out the crystal growth, but also has problem that the chemical resistance or the heat resistance of the obtained crystal (plane) are low.

Also, in the method disclosed in the Nonpatent literature 3 which is the conventional method for the group III polarity growth, it is necessary to supply the group III raw material gas in advance in order to attain the group III polarity growth; and according to the additional test by the present inventors, the straight transmissivity of the light having the wavelength range of 220 nm to 280 nm and the straight transmissivity of the light having the wavelength of 250 nm were both 60% or less which is low which it is thought to be caused by the formation of the extremely thin metallic layer (Al rich layer) which absorbs the light having ultraviolet range.

As such, as the preferred embodiment of the layered body of the present invention; the second group III nitride single crystal layer 3 has the half bandwidth of (102) plane having the crystallinity of 200 arcsec or more and 2500 arcsec or less, the RMS of the surface of said single crystal layer 3 is more than 0.2 nm and 20 nm or less, 90% or more of said surface is the group III polarity plane, and includes the embodiment having the straight transmissivity of the light of the wavelength range of 220 nm to 800 nm is 80% or more. As for further preferable embodiment, the second group III nitride single crystal layer 3 has the half bandwidth of (102) plane having the crystallinity of 250 arcsec or more and 1550 arcsec or less, the RMS of the surface of said single crystal layer 3 is more than 0.2 nm and 10 nm or less, 90% or more of said surface is the group III polarity plane, and includes the embodiment having the straight transmissivity of the light of the wavelength range of 220 nm to 800 nm is 85% or more.

Example

Hereinafter, the present invention will be described in detail using the example and the comparative example; however the present invention is not to be limited thereto.

Example 1

Thermal Cleaning

As for the sapphire substrate, the C plane substrate tilted by 0.15° to the M axis direction was used. This was set onto the susceptor in the MOCVD device, then while the hydrogen was introduced by the flowing amount of 10 slm, the sapphire substrate was heated to 1250° C., and it was held for 10 minutes. Note that, in this MOCVD device, at the place where the temperature becomes 1000° C. or more by the radiation heat during the heating of the sapphire substrate, to the surface portion thereof, the member produced by boron nitride ceramics was placed.

(The First Growing Step)

Next, the temperature of the sapphire substrate is decreased to 950° C., and AlN initial single crystal layer having the thickness of 20 nm was formed (the initial single crystal layer was formed) under the condition of, the trimethylaluminum flow amount of 6.6 μmol/min, the ammonium flow amount of 1 slm, the oxygen flow amount of 0.5 sccm, the whole flow amount of 10 slm, and the pressure of 40 Torr. Here, as for the oxygen source (the gas including the oxygen), high purity oxygen (purity>5N) was used. Said high purity oxygen was mixed with hydrogen and supplied on the substrate as the diluted gas of 1.0% so that the oxygen flow amount becomes the above mentioned amount.

(The Second Growing Step)

Next, the whole flow amount was maintained at 10 slm, the supply of trimethylaluminum was stopped and only the ammonium was supplied to the sapphire substrate, then the temperature was raised to 1200° C. Then, 0.5 μm of AlN single crystal layer (the second group III nitride single crystal layer) was formed under the condition of the same temperature, trimethylaluminum flow amount of 26 μmol/min, the ammonium flow amount of 0.5 slm, the whole flow amount of 10 slm, and the pressure 25 Torr; thereby the layered body was produced. Note that, in this second growing step, the oxygen source was not supplied.

(The Evaluation of the Layered Body)

The obtained layered body was removed from MOCVD device, then the rocking curve measurement was carried out at the (102) plane under the condition of the accelerating voltage of 45 kV and accelerating electric current of 40 mA, using the high resolution X ray diffraction device (X'Pert made by Spectris Co., Ltd., PANalytical division). Also, the surface form image of 5 μm square was obtained by atomic force microscope, then RMS was calculated. Then, the layered body was cut in the size of 8 mm square or so, and in regards with one of the arbitrary sample already been cut, the quantitative analysis of the oxygen was carried out by the secondary ion mass spectrometric analysis method using cesium ion as the primary ion. The oxygen concentration in AlN layer (the initial single crystal layer and the second group III nitride single crystal layer) was determined based on the AlN standard sample. The result is shown in Table 1. Further, the result of the measurement of the straight transmissivity of the light of wavelength range of 220 nm to 800 nm and the wave length of 250 nm by using the ultraviolet spectrophotometer (made by Simadzu Corporation) were both 87% to 97%.

After immersing different cut sample (layered body) from the above into the KOH solution (10 wt %) for 1 min, the surface condition was observed using the differential interference microscope, the polarity of the AlN layer (the second group III nitride single crystal layer) was determined from the presence of the etching. The evaluation result is shown in Table 1. Also, the result of the rocking curve measurement of the (102) plane and the result of the polarity determination are plotted against the oxygen concentration obtained by the secondary ion mass spectrometry, which is shown in FIG. 2.

Example 2

In order to further accurately analyze the oxygen concentration of the initial single crystal layer in the layered body obtained in Example 1, the layered body was produced under the same condition as the example 1, except for changing the oxygen gas used in the example 1 to the stable oxygen isotope (mass number 18) having 99.9 atm %. The obtained result is shown in Table 1.

Example 3

The layered body was produced under the same condition as the example 1, except for changing the oxygen flow amount to 1.0 sccm at the first growing step of the example 1. The obtained result is shown in Table 1 and FIG. 2.

Example 4

The layered body was produced under the same condition as the example 1, except for changing the oxygen flow amount to 0.3 sccm at the first growing step of the example 1. The obtained result is shown in Table 1 and FIG. 2.

Example 5

The layered body was produced under the same condition as the example 1, except for changing the thickness of the AlN initial single crystal layer to 30 nm at the first growing step of the example 1. The obtained result is shown in Table 1 and FIG. 2.

Comparative Example 1

The layered body was produced under the same condition as the example 1, except for changing the oxygen flow amount to 0.1 sccm at the first growing step of the example 1. The obtained result is shown in Table 1 and FIG. 2.

Comparative Example 2

The layered body was produced under the same condition as the example 1, except that the oxygen was not supplied at the first growing step of the example 1. The obtained result is shown in Table 1 and FIG. 2.

Comparative Example 3

The layered body was produced under the same condition as the example 1, except for changing the oxygen flow amount to 2.0 sccm at the first growing step of the example 1. The obtained result is shown in Table 1 and FIG. 2.

Comparative Example 4

The layered body was produced under the same condition as the example 1, except for changing the membrane thickness of the initial single crystal layer to 50 nm at the first growing step of the example 1. The obtained result is shown in Table 1 and FIG. 2.

Comparative Example 5

The layered body was produced under the same condition as the example 1, except for changing the membrane thickness of the initial single crystal layer to 10 nm at the first growing step of the example 1. The obtained result is shown in Table 1 and FIG. 2.

TABLE 1

|  | Initial single crystal layer | | | Group III nitride single crystal layer | | |
| --- | --- | --- | --- | --- | --- | --- |
|  | Oxygen concentration [$cm^{-3}$] | Thickness (nm) | Polarity | RMS [nm] | Oxygen Concentration [$cm^{-3}$] | (102) face half bandwidth |
| Example 1 | $1.4 \times 10^{21}$ | 20 | Al polarity | 0.8 | $5.4 \times 10^{18}$ | 1512 |
| Example 2 | $1.4 \times 10^{21}$ | 20 | Al polarity | 1.2 | $6.0 \times 10^{18}$ | 1510 |
| Example 3 | $2.9 \times 10^{21}$ | 20 | Al polarity | 0.3 | $1.0 \times 10^{18}$ | 2488 |
| Example 4 | $6.2 \times 10^{20}$ | 20 | Al polarity | 2.1 | $8.1 \times 10^{18}$ | 1383 |
| Example 5 | $1.3 \times 10^{21}$ | 30 | Al polarity | 0.4 | $1.2 \times 10^{18}$ | 2310 |
| Comparative example 1 | $4.0 \times 10^{18}$ | 20 | N polarity | 10.5 | $3.4 \times 10^{19}$ | 1400 |
| Comparative example 2 | $8.8 \times 10^{19}$ | 20 | N polarity | 22.8 | $2.8 \times 10^{19}$ | 1254 |
| Comparative example 3 | $7.8 \times 10^{21}$ | 20 | Al polarity | 0.2 | $1.0 \times 10^{18}$ | 3560 |
| Comparative example 4 | $1.5 \times 10^{21}$ | 50 | Al polarity | 0.2 | $1.0 \times 10^{18}$ | 3830 |
| Comparative example 5 | $8.2 \times 10^{20}$ | 10 | N polarity | 7.0 | $4.0 \times 10^{19}$ | 1056 |

REFERENCES OF THE NUMERALS

1 Sapphire substrate (optical base material)
2 Initial single crystal layer
3 Second group III nitride single crystal layer

The invention claimed is:
1. A layered body having a single crystal layer comprising a group III nitride satisfying a composition shown by $Al_XGa_Y In_ZN$ (wherein, X, Y and Z are rational numbers respectively satisfying $0.9 \leq X \leq 1.0$, $0.0 \leq Y \leq 0.1$, $0.0 \leq Z \leq 0.1$, and $X+Y+Z=1.0$) on a sapphire substrate, and said layered body has an initial single crystal layer comprising the group III nitride satisfying said composition and containing oxygen in a concentration of $1 \times 10^{20}$ $cm^{-3}$ or more and $5 \times 10^{21}$ $cm^{-3}$ or less in a thickness of 15 nm or more and 40 nm or less on said sapphire substrate, and a second group III nitride single crystal layer comprising the group III nitride satisfying said composition having reduced oxygen concentration than the initial single crystal layer.

2. The layered body as set forth in claim 1 wherein a surface of said second nitride single crystal layer is a group III polarity plane.

3. A semiconductor device comprising the layered body as set forth in claim 1.

4. A semiconductor device comprising the layered body as set forth in claim 2.

5. A layered body, comprising:
an initial single crystal layer comprising a group III nitride having a composition shown by $Al_XGa_YIn_ZN$, wherein, X, Y and Z are rational numbers respectively satisfying $0.9 \leq X \leq 1.0$, $0.0 \leq Y \leq 0.1$, $0.0 \leq Z \leq 0.1$, and $X+Y+Z=1.0$, and containing oxygen in a concentration of $1 \times 10^{20}$ cm$^{-3}$ to $5 \times 10^{21}$ cm$^{-3}$ in a thickness of 15 nm to 40 nm on a sapphire substrate, and a second group III nitride single crystal layer comprising a group III nitride satisfying said composition having reduced oxygen concentration than the initial single crystal layer.

* * * * *